(12) United States Patent
Tu et al.

(10) Patent No.: US 10,276,489 B2
(45) Date of Patent: *Apr. 30, 2019

(54) SERIES MIM STRUCTURES

(71) Applicant: Taiwan Semiconductor Manufacturing Co., Ltd., Hsin-Chu (TW)

(72) Inventors: Kuo-Chi Tu, Hsin-Chu (TW); Chin-Chieh Yang, New Taipei (TW); Wen-Ting Chu, Kaohsiung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/942,760

(22) Filed: Apr. 2, 2018

(65) Prior Publication Data
US 2018/0226340 A1 Aug. 9, 2018

Related U.S. Application Data

(63) Continuation of application No. 15/418,904, filed on Jan. 30, 2017, now Pat. No. 9,947,617, which is a
(Continued)

(51) Int. Cl.
*H01L 23/522* (2006.01)
*H01L 27/08* (2006.01)
(Continued)

(52) U.S. Cl.
CPC .... *H01L 23/5223* (2013.01); *H01L 21/76895* (2013.01); *H01L 23/528* (2013.01);
(Continued)

(58) Field of Classification Search
CPC ........... H01L 21/76895; H01L 23/5223; H01L 23/5226; H01L 23/528; H01L 27/2418;
(Continued)

(56) References Cited

U.S. PATENT DOCUMENTS 6,803,641 B2 10/2004 Papa Rao et al.
8,436,408 B2 5/2013 Tu et al.
(Continued)

FOREIGN PATENT DOCUMENTS

KR 20140011899 A 1/2014
WO 2008087499 A1 7/2008

OTHER PUBLICATIONS

Non-Final Office Action dated Jul. 22, 2016 for U.S. Appl. No. 14/883,808.
(Continued)

*Primary Examiner* — Allan R Wilson
(74) *Attorney, Agent, or Firm* — Eschweiler & Potashnik, LLC

(57) ABSTRACT

The present disclosure relates to an integrated circuit configured to mitigate damage to MIM decoupling capacitors. In some embodiments, the integrated chip has a lower interconnect layer vertically separated from a substrate by a first inter-level dielectric (ILD) layer. A conductive contact extends from a transistor device within the substrate to an uppermost surface of the first ILD layer. A plurality of MIM (metal-insulator-metal) structures are arranged over the lower interconnect layer. An upper interconnect layer is over the plurality of MIM structures. One or both of the lower interconnect layer and the upper interconnect layer are comprised within a conductive path that electrically couples the plurality of MIM structures in a series connection.

20 Claims, 8 Drawing Sheets

Related U.S. Application Data continuation of application No. 14/883,808, filed on Oct. 15, 2015, now Pat. No. 9,601,545.

(51) Int. Cl.
| | |
|---|---|
| *H01L 27/24* | (2006.01) |
| *H01L 21/768* | (2006.01) |
| *H01L 23/528* | (2006.01) |
| *H01L 49/02* | (2006.01) |
| *H01L 45/00* | (2006.01) |
| *H01L 27/06* | (2006.01) |
| *H01L 27/10* | (2006.01) |

(52) U.S. Cl.
CPC ...... *H01L 23/5226* (2013.01); *H01L 27/0805* (2013.01); *H01L 27/24* (2013.01); *H01L 27/2436* (2013.01); *H01L 27/2463* (2013.01); *H01L 28/60* (2013.01); *H01L 27/0629* (2013.01); *H01L 27/101* (2013.01); *H01L 45/08* (2013.01); *H01L 45/1233* (2013.01); *H01L 45/1253* (2013.01); *H01L 45/146* (2013.01); *H01L 45/16* (2013.01); *H01L 45/1608* (2013.01)

(58) Field of Classification Search
CPC . H01L 27/2463; H01L 28/60; H01L 45/1233; H01L 45/1253; H01L 45/16
See application file for complete search history.

(56) References Cited

U.S. PATENT DOCUMENTS

| | | | |
|---|---|---|---|
| 8,659,121 B2 | 2/2014 | Tu et al. | |
| 8,896,096 B2 | 11/2014 | Tu et al. | |
| 9,224,461 B2 | 12/2015 | Karpov et al. | |
| 2004/0046203 A1 | 3/2004 | Morimoto et al. | |
| 2004/0124496 A1* | 7/2004 | Rao | H01L 27/0805 257/532 |
| 2007/0152295 A1 | 7/2007 | Yeh et al. | |
| 2008/0265371 A1* | 10/2008 | Park | H01G 4/33 257/532 |
| 2010/0065944 A1 | 3/2010 | Tu et al. | |
| 2010/0219502 A1* | 9/2010 | Shieh | H01L 23/5223 257/532 |
| 2011/0220861 A1 | 9/2011 | Himeno et al. | |
| 2012/0132882 A1 | 5/2012 | Seo et al. | |
| 2014/0021584 A1 | 1/2014 | Tu et al. | |
| 2014/0063913 A1 | 3/2014 | Kawashima | |
| 2014/0092666 A1 | 4/2014 | Karpov et al. | |
| 2015/0102459 A1 | 4/2015 | Lai et al. | |
| 2015/0214150 A1* | 7/2015 | Chang | H01L 23/5256 257/529 |
| 2015/0263279 A1 | 9/2015 | Hayakawa et al. | |
| 2017/0018709 A1 | 1/2017 | Wu et al. | |
| 2017/0077214 A1 | 3/2017 | Mudakatte et al. | |

OTHER PUBLICATIONS

Notice of Allowance dated Nov. 9, 2016 for U.S. Appl. No. 14/883,808.

Non-Final Office Action dated Aug. 16, 2017 for U.S. Appl. No. 15/418,904.

Notice of Allowance dated Dec. 5, 2017 for U.S. Appl. No. 15/418,904.

* cited by examiner

# SERIES MIM STRUCTURES

REFERENCE TO RELATED APPLICATIONS

This Application is a Continuation of U.S. application Ser. No. 15/418,904 filed on Jan. 30, 2017, which is a Continuation of U.S. application Ser. No. 14/883,808 filed on Oct. 15, 2015 (now U.S. Pat. No. 9,601,545 issued on Mar. 21, 2017). The contents of the above-referenced matters are hereby incorporated by reference in their entirety.

BACKGROUND

Integrated chips are formed on semiconductor die comprising millions or billions of transistor devices. The transistor devices are configured to act as switches and/or to produce power gains so as to enable logical functionality for an integrated chip (e.g., form a processor configured to perform logic functions). Integrated chips often also comprise passive devices, such as capacitors, resistors, inductors, varactors, etc. Passive devices are widely used to control integrated chip characteristics (e.g., gain, time constants, etc.) and to provide a single integrated chip with a wide range of different functionalities (e.g., manufacturing analog and digital circuitry on the same die).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
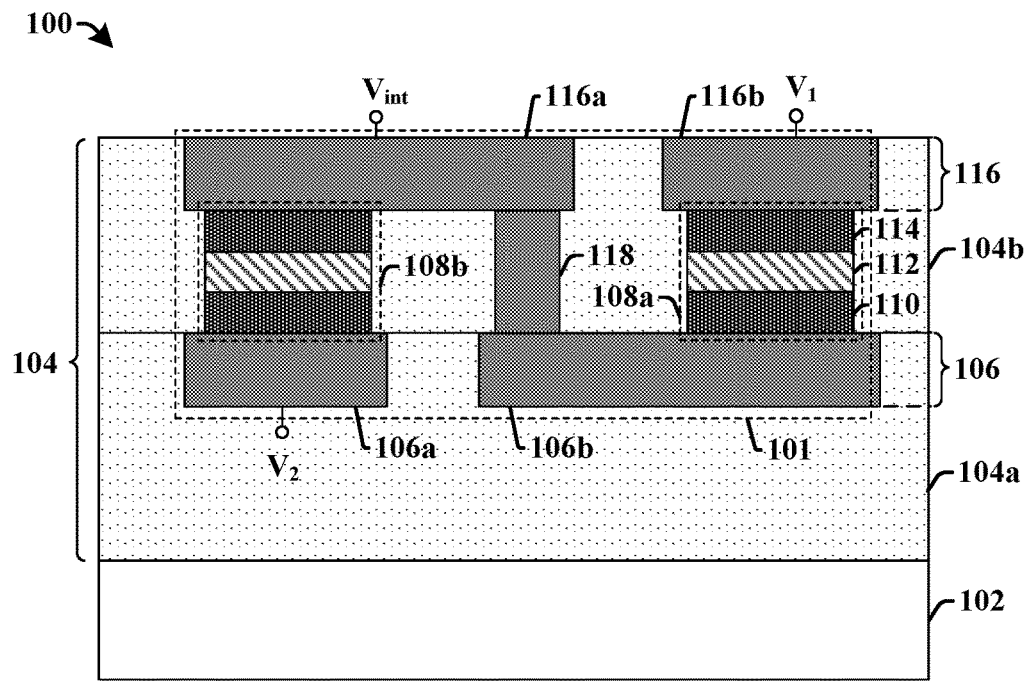
FIG. 1 illustrates some embodiments of an integrated chip comprising a voltage divider having a plurality of MIM (metal-insulator-metal) structures.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

MIM (metal-insulator-metal) capacitors are a particular type of capacitor, having a top metal plate and a bottom metal plate separated by a capacitor dielectric, which are often implemented in integrated circuits. MIM capacitors are often integrated into a back-end-of-the-line (BEOL) metallization stack, at a position that is vertically disposed between an underlying first metal layer and an overlying second metal layer. MIM capacitors can be used as decoupling capacitors configured to mitigate switching noise on a power supply line caused by switching of logic devices within an integrated chip. For example, MIM capacitors may be used to reduce switching noise due to a voltage drop on a power supply line caused by simultaneous switching of input/output (I/O) and core circuits within an integrated chip. Without decoupling capacitors this switching noise may increase signal delay, thereby reducing the operating frequency of an integrated circuit, and inadvertently causing state transitions in logic circuits within the integrated circuit.

As the size of integrated chip components decreases, the dielectric layer reliability voltage limit (e.g., time dependent dielectric breakdown voltage, etc.) of modern MIM capacitor also decreases, limiting the application of a MIM capacitor as a decoupling capacitor. For example, for a MIM capacitor having a dielectric layer reliability voltage limit of 0.8 volts, a voltage difference between electrodes of the MIM capacitor over 0.8 volts may damage the dielectric layer of the MIM capacitor. However, in modern integrated chip, the supply voltage is often greater than the dielectric layer reliability voltage limit (e.g., time dependent dielectric breakdown voltage) of a MIM decoupling capacitor, resulting in damage to the MIM decoupling capacitor.

Some embodiments of the present disclosure relates to a method of forming an integrated circuit that prevents damage to MIM decoupling capacitors, and an associated structure. In some embodiments, the method comprises forming one or more lower metal interconnect structures within a lower inter-level dielectric (ILD) layer over a substrate. A plurality of MIM structures are formed over the one or more lower metal interconnect structures. One or more upper metal interconnect structures are formed within an upper ILD layer over the plurality of MIM structures. Together the lower and upper metal interconnect structures electrically couple the plurality of MIM structures in a series connection between a first voltage potential and a second voltage potential. By placing the plurality of MIM structures in a series connection, dissipation of the first voltage potential (e.g., a supply voltage) is spread out over the plurality of MIM structures, thereby reducing the voltage potential difference between electrodes of any one of the MIM structures. Reducing the voltage potential difference, allows for the voltage potential across a MIM structure to be held below the reliability voltage limit (e.g., time dependent dielectric breakdown voltage, etc.), thereby allowing the MIM structures to be used as a decoupling capacitor in a system having a supply voltage greater than the reliability voltage limit FIG. 1 illustrates some embodiments of an integrated chip 100 comprising a voltage divider circuit 101 having a plurality of MIM (metal-insulator-metal) structures.

The integrated chip 100 comprises a substrate 102. In some embodiments, the substrate 102 may comprise a semiconductor material, such as silicon, having an n-type or a p-type doping. A back-end-of-the-line (BEOL) metallization stack is arranged over the substrate 102. The BEOL metallization stack comprises a plurality of MIM structures, 108a and 108b, arranged within an inter-level dielectric (ILD) layer 104 disposed over the substrate 102. The plurality of MIM structures, 108a and 108b, respectively comprise a first electrode and a second electrode separated by a dielectric layer. For example, the MIM structures in some embodiments comprise a lower electrode 110 that is vertically separated from an upper electrode 114 by a capacitor dielectric layer 112. The ILD layer 104 may comprise one or more separate dielectric layers (e.g., a low-k dielectric material, an ultra low-k dielectric material, etc.) stacked onto one another over the substrate 102. For example, the ILD layer may comprise a lower ILD layer 104a and an upper ILD layer 104b. The ILD layer 104 laterally separates the plurality of MIM structures, 108a and 108b, from one another.

The BEOL metallization stack further comprises a plurality of metal interconnect layers arranged within the ILD layer 104. The plurality of metal interconnect layers comprise a lower metal interconnect layer 106 and an upper metal interconnect layer 116. The ILD layer 104 vertically separates the lower metal interconnect layer 106 from the substrate 102. The lower electrodes 110 of the plurality of MIM structures, 108a and 108b, are in contact with the lower metal interconnect layer 106, and the upper electrodes 114 are in contact with the upper metal interconnect layer 116. In some embodiments, the lower metal interconnect layer 106 and the upper metal interconnect layer 116 may comprise one or more metal interconnect structures laterally separated from one another by the ILD layer 104. For example, the lower metal interconnect layer 106 may comprise a first lower metal interconnect structure 106a and a second lower metal interconnect structure 106b, and the upper metal interconnect layer 116 may comprise a first upper metal interconnect structure 116a and a second upper metal interconnect metal structure 116b. In some embodiments, the lower metal interconnect layer 106 and the upper metal interconnect layer 116 may comprise metal wire layers configured to provide for an interconnection in a lateral direction (i.e., parallel to an upper surface of the substrate 102).

The lower metal interconnect layer 106 and the upper metal interconnect layer 116 are comprised within a conductive path that electrically connects the plurality of MIM capacitors, 108a and 108b, in a series connection (i.e., along a single electrically conductive path) extending between a first voltage potential $V_1$ and a second voltage potential $V_2$, which is less than the first voltage potential $V_1$. For example, as shown in integrated chip 100, an electrode of a first MIM structure 108a is coupled to an electrode of a second MIM structure 108b by way of an conductive path comprising the lower metal interconnect layer 106, the upper metal interconnect layer 116, and a via 118 vertically extending between the lower metal interconnect layer 106 and the upper metal interconnect layer 116. In some embodiments, the first voltage potential $V_1$ may be a supply voltage ($V_{DD}$) and the second voltage potential $V_2$ may be a ground voltage (i.e., a voltage potential of zero).

Connecting the plurality of MIM structures, 108a and 108b, in series between the first voltage potential $V_1$ and the second voltage potential $V_2$, causes a voltage drop between the first voltage potential $V_1$ and the second voltage potential $V_2$ to be distributed (i.e., spread out) between the plurality of MIM structures, 108a and 108b. This results in one or more intermediate voltage nodes $V_{int1}$ with voltage potentials between the first voltage potential $V_1$ and the second voltage potential $V_2$ (e.g., each of the plurality of MIM structures, 108a and 108b, will respectively provide for a voltage drop less than the difference between the first voltage potential $V_1$ and the second voltage potential $V_2$). By generating one or more intermediate voltages along the conductive path coupling the plurality of MIM structures, 108a and 108b, the potential voltage difference between electrodes of any one of the plurality of MIM structures, 108a and 108b, can be held to a relatively low value that is less than a reliability voltage limit (e.g., time dependent dielectric breakdown voltage, etc.), thereby preventing damage to the capacitor dielectric layer 112 of the MIM structures, 108a and 108b.

Figure 2:
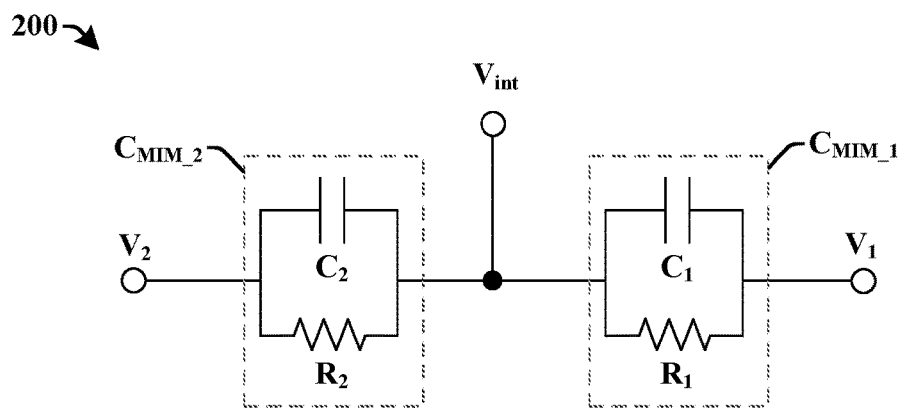
FIG. 2 illustrates some embodiments of a schematic diagram of a voltage divider comprising a plurality of MIM structures.

FIG. 2 illustrates some embodiments of a schematic diagram of a disclosed voltage divider 200 comprising a plurality of MIM structures.

The voltage divider 200 comprises a plurality of MIM structures, $C_{MIM\_1}$ and $C_{MIM\_2}$ connected in series between a first voltage potential $V_1$ and a second voltage potential $V_2$. The plurality of MIM structures, $C_{MIM\_1}$ and $C_{MIM\_2}$, may respectively comprise a capacitance $C_n$ (n=1, 2) and an intrinsic resistance $R_n$ (n=1, 2). The plurality of MIM structures, $C_{MIM\_1}$ and $C_{MIM\_2}$, respectively cause a voltage drop to occur between the first voltage potential $V_1$ and the second voltage potential $V_2$, which is is proportional to a capacitance and/or intrinsic resistance of a MIM structure. For example, a first MIM structure $C_{MIM\_1}$ will cause a first voltage drop $\Delta V_1$ proportional to the capacitance and/or intrinsic resistance of the first MIM structure $C_{MIM\_1}$, and a second MIM structure $C_{MIM\_2}$ will cause a second voltage drop $\Delta V_2$ proportional to the capacitance and/or intrinsic resistance of the second MIM structure $C_{MIM\_2}$. The voltage drop $\Delta V_1$ of the first MIM capacitor $C_{MIM\_1}$ results in an intermediate voltage, having a value between the first voltage potential $V_1$ and the second voltage potential $V_2$, at an intermediate voltage node $V_{int}$ located between the first MIM structure $C_{MIM\_1}$ and the second MIM structure $C_{MIM\_2}$.

In some embodiments, the first and second MIM structures, $C_{MIM\_1}$ and $C_{MIM\_2}$, may have substantially same capacitance and/or resistance values. In such embodiments, the voltage dissipated by the first and second MIM structures, $C_{MIM\_1}$ and $C_{MIM\_2}$, is equal. For example, for a first voltage potential with a value of $V_1$ approximately equal to 1.2 V, the first voltage drop $\Delta V_1$ will be approximately 0.6 V and the second voltage drop $V_2$ will be approximately 0.6 V, resulting in a voltage potential at the intermediate voltage node $V_{int}$ of approximately 0.6 V.

Since the difference in voltage potential between the first voltage potential $V_1$ and the second voltage potential $V_2$ is shared between the plurality of MIM structures, $C_{MIM\_1}$ and $C_{MIM\_2}$, each voltage drop $\Delta V_1$ and $\Delta V_2$ can be made to be smaller than a reliability voltage limit (e.g., time dependent dielectric breakdown voltage, etc.) of the MIM structures, $C_{MIM\_1}$ and $C_{MIM\_2}$, so that the MIM structures can be used as decoupling capacitors.

Figure 3:
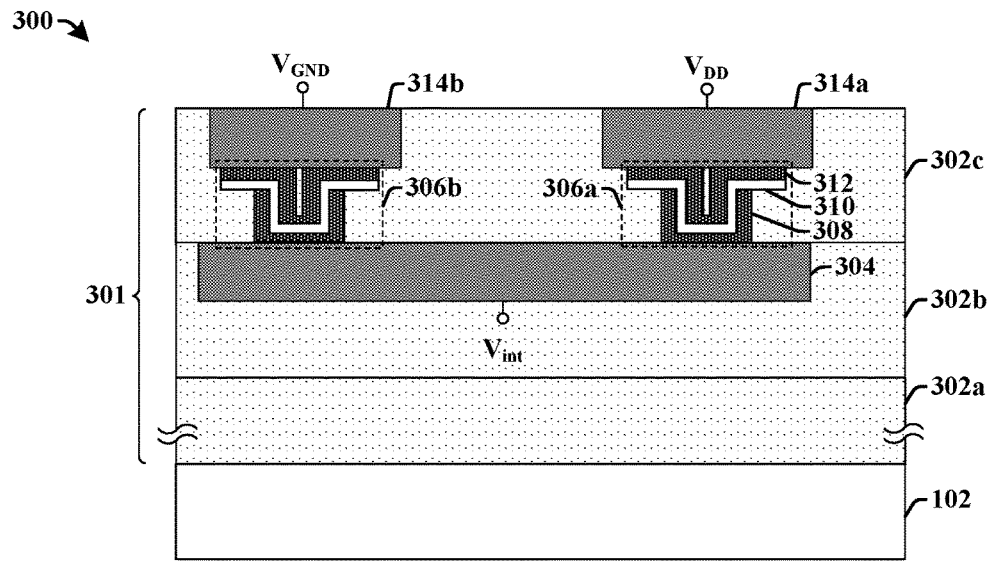
FIGS. 3-6 illustrate some alternative embodiments of integrated chip comprising a voltage divider having a plurality of MIM capacitors.

FIG. 3 illustrates some alternative embodiments of an integrated chip 300 comprising a voltage divider having a plurality of MIM capacitors.

Integrated chip 300 comprises a dielectric structure 301 comprising a plurality of dielectric layers 302a-302c stacked onto one another. In various embodiments, the plurality of dielectric layers 302a-302c may comprise a low-k dielectric material, an ultra low-k dielectric material, an extreme low-k dielectric material, and/or an oxide. A first MIM capacitor 306a and a second MIM capacitor 306b are arranged within the dielectric structure 301. The first MIM capacitor 306a and the second MIM capacitor 306b respectively comprise a lower electrode 308 and an upper electrode 312 separated by a capacitor dielectric layer 310.

In various embodiments, the lower electrode 308 and the upper electrode 312 may comprise platinum (Pt), aluminum-copper (AlCu), titanium nitride (TiN), gold (Au), titanium (Ti), tantalum (Ta), tantalum nitride (TaN), tungsten (W), tungsten nitride (WN), and/or copper (Cu), for example. In various embodiments, the capacitor dielectric layer 310 may comprise nickel oxide (NiO), titanium oxide (TiO), hafnium oxide (HfO), zirconium oxide (ZrO), zinc oxide (ZnO), tungsten oxide (WO$_3$), aluminum oxide (Al$_2$O$_3$), tantalum oxide (TaO), molybdenum oxide (MoO), and/or copper oxide (CuO), for example.

The first and second MIM capacitors, 306a and 306b, are connected in series between a supply voltage $V_{DD}$ and a ground voltage $V_{GND}$ (i.e., zero volts) by way of a single metal layer continuously extending between the first MIM capacitor 306a and the second MIM capacitor 306b. For example, in some embodiments, the first MIM capacitor 306a has an upper electrode 312 connected to a first upper metal interconnect structure 314a contacting a power rail (i.e., a power supply line) held at the supply voltage potential $V_{DD}$ and a lower electrode 308 connected to a lower metal interconnect structure 304. The lower metal interconnect structure 304 continuously extends to a lower electrode 308 of the second MIM capacitor 306b, which has an upper electrode 312 connected to a second upper metal interconnect structure 314b held at the ground voltage potential $V_{GND}$.

Although integrated chip 300 illustrates the lower electrodes 308 of the first and second MIM capacitors, 306a and 306b, as being connected by a lower metal interconnect continuously extending between the electrodes, it will be appreciated that in other embodiments, the upper electrodes 312 of the first and second MIM capacitors, 306a and 306b, may be connected by an upper metal interconnect structure continuously extending between the electrodes.

In some embodiments, the first and second MIM capacitors, 306a and 306b, may be cup-shaped capacitors. The cup-shaped capacitors comprise a lower electrode 308 having a 'U' shape with a cavity. A capacitor dielectric layer 310 is arranged within the lower electrode 308 and extends from within the cavity in the lower electrode 308 to a location overlying the lower electrode 308. An upper electrode 312 is arranged on the capacitor dielectric layer 310 and extends from within the cavity in the lower electrode 308 to a location overlying the capacitor dielectric layer 310. In alternative embodiments, the first and second MIM capacitors, 306a and 306b, may have alternate structures (e.g., a planar capacitor structure, a bar-shaped capacitor structure, etc.)

Figure 4:
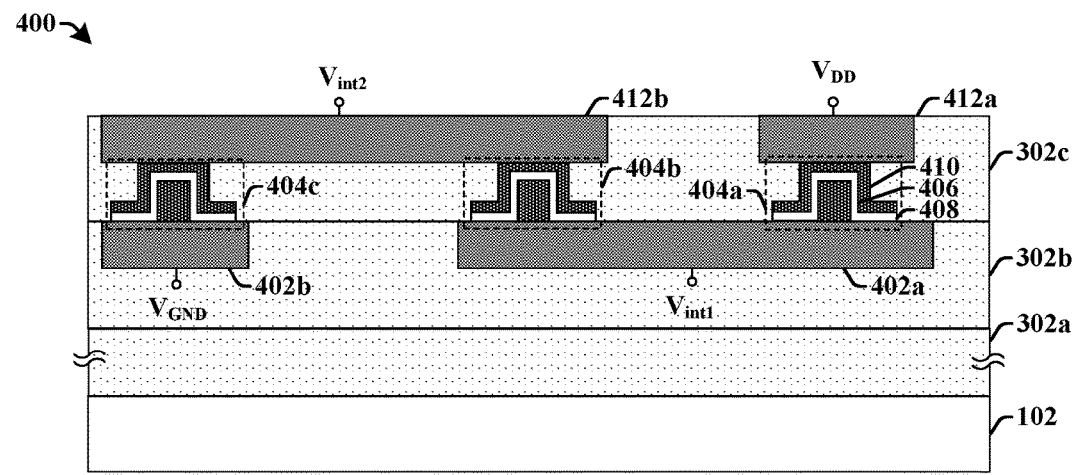

FIG. 4 illustrates some alternative embodiments of an integrated chip 400 comprising a voltage divider having a plurality of MIM capacitors.

Integrated chip 400 comprises a first MIM capacitor 404a, a second MIM capacitor 404b, and a third MIM capacitor 404c arranged in series between a supply voltage $V_{DD}$ and a ground voltage $V_{GND}$. The first MIM capacitor 404a has an upper electrode 410 connected to a first upper metal interconnect structure 412a held at the supply voltage $V_{DD}$ and a lower electrode 406 connected to a first lower metal interconnect structure 402a. The first lower metal interconnect structure 402a continuously extends between the lower electrode 406 of the first MIM capacitor 404a and a lower electrode 406 of the second MIM capacitor 404b. The second MIM capacitor 404b has an upper electrode 410 connected to a second upper metal interconnect structure 412b that continuously extends to an upper electrode 410 of the third MIM capacitor 404c. The third MIM capacitor 404c has a lower electrode 406 connected to a second lower metal interconnect structure 402b held at the ground voltage $V_{GND}$.

Each of the plurality of MIM capacitors 404a-404c cause a voltage drop to occur that is proportional to a capacitance and/or resistance of the MIM capacitor, resulting in a plurality of intermediate voltages, having varying values between the supply voltage $V_{DD}$ and the ground voltage $V_{GND}$, at intermediate voltage nodes $V_{int1}$-$V_{int2}$ located between the first MIM capacitor 404a and the third MIM capacitor 404c. For example, the first lower metal interconnect structure 402a has a first intermediate voltage potential at a first intermediate voltage node $V_{int1}$ (due to the voltage drop caused by the first MIM capacitor 404a) and the second upper metal interconnect structure 412b has a second intermediate voltage potential at a second intermediate voltage node $V_{int2}$ (due to the voltage drop caused by the second MIM capacitor 404b).

In some embodiments, the plurality of MIM capacitors 404a-404c may have a substantially same value. In such embodiments, the voltage dissipated by the plurality of MIM capacitors 404a-404c is equal. For example, for a first voltage potential with a value of $V_1$=1.2 V, a first voltage drop of the first MIM capacitor 404a will be approximately 0.4 V, a second voltage drop of the second MIM capacitor 404b will be approximately 0.4 V, and a third voltage drop of a third MIM capacitor 404c will be approximately 0.4 V. The voltage drops result in a first intermediate voltage at $V_{int1}$ of approximately 0.8 V and a second intermediate voltage at $V_{int2}$ of approximately 0.4 V.

In some embodiments, the plurality of MIM capacitors 404a-404c may comprise bar shaped capacitors comprising a rectangular shaped lower electrode 406. A capacitor dielectric layer 408, having a plurality of lateral segments connected by vertical segments, contacts sidewalls of the lower electrode 406. An upper electrode 410 is arranged onto sidewalls and upper surfaces of the lateral segments of the capacitor dielectric layer 408. In alternative embodiments, the plurality of MIM capacitors 404a-404c may have alternate structures (e.g., a planar capacitor structure, a cup-shaped capacitor structure, etc.).

Figure 5:
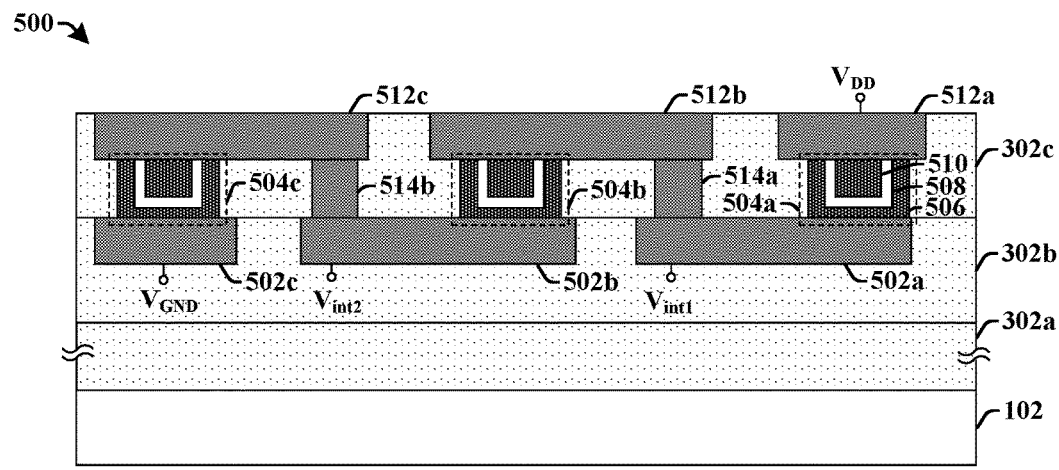

FIG. 5 illustrates some alternative embodiments of an integrated chip 500 comprising a voltage divider having a plurality of MIM capacitors.

Integrated chip 500 comprises a first MIM capacitor 504a, a second MIM capacitor 504b, and a third MIM capacitor 504c arranged in series between a supply voltage $V_{DD}$ and a ground voltage $V_{GND}$. The first MIM capacitor 504a has an upper electrode 510 connected to a first upper metal interconnect structure 512a held at the supply voltage $V_{DD}$ and a lower electrode 506 connected to a first lower metal interconnect structure 502a. The first lower metal interconnect structure 502a is connected to a second upper metal interconnect structure 512b contacting an upper electrode 510 of the second MIM capacitor 504b by way of a first via 514a laterally separated from the first MIM capacitor 504a. The second MIM capacitor 406b has a lower electrode 506 connected to a second lower metal interconnect structure 502b. The second lower metal interconnect structure 502b is connected to a third upper metal interconnect structure 512c contacting an upper electrode 510 of the third MIM capacitor 504c by way of a second via 514b laterally separated from the second MIM capacitor 504b. The third MIM capacitor 504c has a lower electrode 506 connected to a third lower metal interconnect structure 502c held at the ground voltage $V_{GND}$.

The first lower metal interconnect structure 502a has a first intermediate voltage potential at a first intermediate voltage node $V_{int1}$ (due to the voltage drop caused by the first MIM capacitor 504a) and the second metal interconnect structure 502b has a second intermediate voltage potential at a second intermediate voltage node $V_{int2}$ (due to the voltage drop caused by the second MIM capacitor 504b).

In some embodiments, MIM capacitors 504a-504c may comprise dual damascene capacitors comprising a 'U' shaped capacitor dielectric layer 508 nested within a 'U' shaped lower electrode 506, and a rectangular shaped upper electrode 510 nested within the 'U' shaped capacitor dielectric layer 508. In other embodiments, the MIM capacitors 504a-504c may have alternate structures (e.g., a planar capacitor structure, a bar-shaped capacitor structure, etc.)

Figure 6:
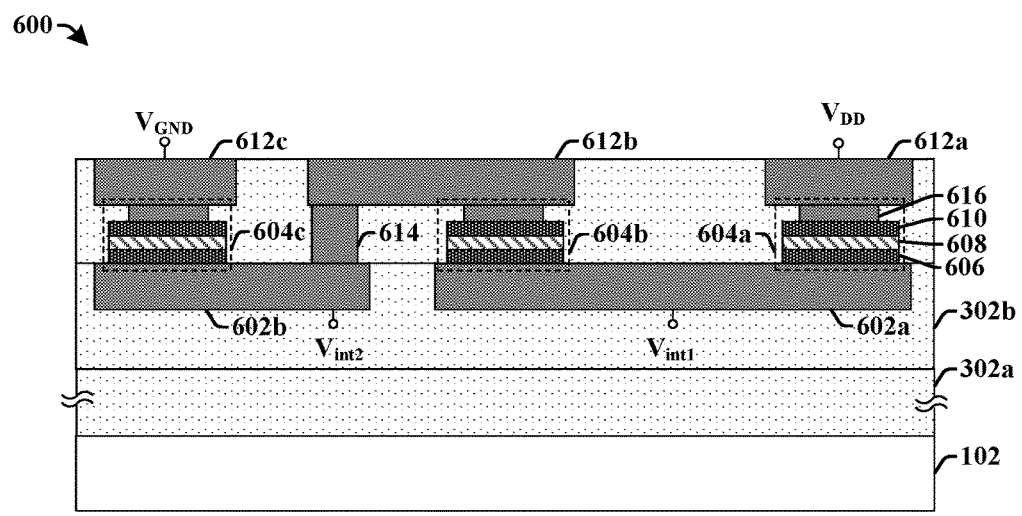

FIG. 6 illustrates some alternative embodiments of an integrated chip 600 comprising a voltage divider having a plurality of MIM capacitors.

Integrated chip 600 comprises a first MIM capacitor 604a, a second MIM capacitor 604b, and a third MIM capacitor 604c arranged in series between a supply voltage $V_{DD}$ and a ground voltage $V_{GND}$. The first MIM capacitor 604a has an upper electrode 610 connected to a first upper metal interconnect structure 612a held at the supply voltage $V_{DD}$ and a lower electrode 606 connected to a first lower metal interconnect structure 602a. The first lower metal interconnect structure 602a continuously extends between the lower electrode 606 of the first MIM capacitor 604a and a lower electrode 606 of the second MIM capacitor 604b. The second MIM capacitor 604b has an upper electrode 610 connected to a second upper metal interconnect structure 612b. The second upper metal interconnect structure 612b is connected to a second lower metal interconnect structure 602b contacting a lower electrode 606 of the third MIM capacitor 604c by way of a via 614 laterally separated from the second MIM capacitor 604b. The third MIM capacitor 604c has an upper electrode 610 connected to a third upper metal interconnect structure 612c held at the ground voltage potential $V_{GND}$.

The first lower metal interconnect structure 602a has a first intermediate voltage potential at a first intermediate voltage node $V_{int1}$ (due to the voltage drop caused by the first MIM capacitor 604a) and the second upper metal interconnect structure 612b has a second intermediate voltage potential at a second intermediate voltage node $V_{int2}$ (due to the voltage drop caused by the second MIM capacitor 604b).

In some embodiments, a metal connection layer 616 may be arranged between the upper electrode 610 and the first upper metal interconnect structure 612a to account for differences in height between the first MIM capacitor 604a and a laterally adjacent via layer (e.g., a via layer in an embedded memory region or a logic region located on another area of an integrated chip). The metal connection layer 616 may comprise a same material as the first upper metal interconnect structure 612a (e.g., copper).

In some embodiments, the MIM capacitors 604a-604c may comprise planar capacitors comprising lower electrode 606 that is substantially planar (i.e., flat), a capacitor dielectric layer 608 that is substantially planar, and an upper electrode 610 that is substantially planar. In alternative embodiments, the MIM capacitors 604a-604c may have alternate structures (e.g., a dual damascene capacitor structure, a cup-shaped capacitor structure, etc.).

Although FIGS. 3-6 illustrate integrated circuits having two or three MIM capacitors connected in series, the present disclosure is not limited to such configurations. Rather, the disclosed voltage divider may comprise any number of MIM capacitors. For example, in some embodiments, the disclosed voltage divider may comprise n MIM capacitors connected in series. In some embodiments, wherein the n MIM capacitors have substantially equal capacitance values, the resulting voltage divider will divide an input signal $V_{DD}$ into n-1 intermediate output voltages having voltage values equal to $V_{DD}-m/n^*V_{DD}$, wherein m is the number of decoupling capacitors between an intermediate output node and the input signal $V_{DD}$.

Figure 7:
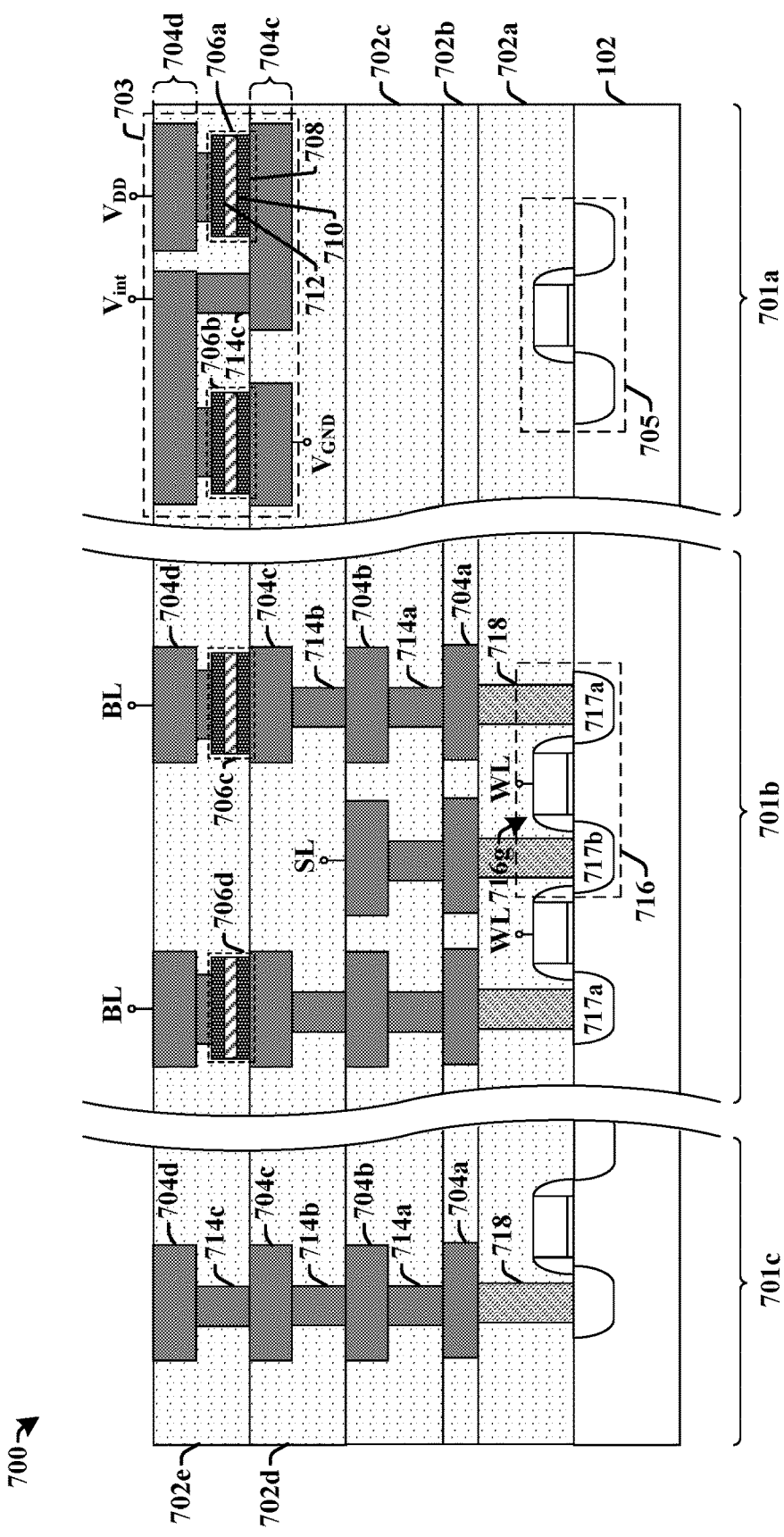
FIG. 7 illustrates some additional embodiments of an integrated chip comprising a voltage divider having a plurality of MIM decoupling capacitors.

FIG. 7 illustrates some embodiments of an integrated chip 700 comprising disclosed voltage divider comprising a plurality of MIM decoupling capacitors.

The integrated chip 700 comprises a decoupling region 701a, an embedded memory region 701b, and a logic region 701c. A plurality of separate dielectric layers 702a-702e are stacked onto one another over a substrate 102. The plurality of separate dielectric layers 702a-702e may comprise one or more of a same dielectric material or one or more different dielectric materials.

The decoupling region 701a comprises a voltage divider 703. The voltage divider 703 comprises a plurality of MIM capacitors 706a-706b having a lower electrode 708 separated from an upper electrode 712 by way of a capacitor dielectric layer 710. The plurality of MIM capacitors 706a-706c are connected in series between a supply voltage $V_{DD}$ and a ground voltage $V_{GND}$ by a conductive path comprising a lower metal wire layer 704c and/or an upper metal wire layer 704d and/or a via layer 714c. In some embodiments, the supply voltage $V_{DD}$ may be provided by a power rail configured to provide the supply voltage to other areas of the integrated chip (e.g., to the embedded memory region 701b and the logic region 701c).

The lower metal wire layer 704c may be vertically separated from the underlying substrate 102 by way of one or more dielectric layers 702a-702d. In various embodiments, the one or more dielectric layers 702a-702d may comprise a low-k dielectric layer, an ultra low-k dielectric layer, an extreme low-k dielectric layer, and/or an oxide layer. In some embodiments, the lower metal wire layer 704c may be vertically separated from one or more underlying transistor devices 705. In some embodiments, the lower metal wire layer 704c and/or the upper metal wire layer 704d may comprise copper metal wires.

An intermediate voltage node $V_{int1}$ is located along the conductive path extending between the plurality of MIM capacitors 706a-706b. The intermediate voltage node $V_{int1}$ has a voltage potential between the supply voltage $V_{DD}$ and the ground voltage $V_{GND}$. The intermediate voltage node $V_{int1}$ provides for voltage drops over the plurality of MIM capacitors 706a-706b that are smaller than a reliability voltage limit (e.g., time dependent dielectric breakdown voltage, etc.) of the plurality of MIM capacitors 706a-706b. This allows the plurality of MIM capacitors 706a-706b to be used as decoupling capacitors configured to maintain a constant voltage between the supply voltage $V_{DD}$ and the ground voltage $V_{GND}$, so as to reduce switching noise on a power rail that supplies the supply voltage $V_{DD}$ to the other areas of the integrated chip 700.

In various embodiments, the plurality of MIM capacitors 706a-706b can be located at any location within a BEOL metallization stack. For example, in various embodiments, the plurality of MIM capacitors 706a-706b can be located in dielectric layer 702c between M1 (a first metal wire layer in a BEOL metallization stack) and M2 (a second metal wire layer in the BEOL metallization stack), in dielectric layer 702d between M2 and M3, in dielectric layer 702e between M3 and M4, etc.

The embedded memory region 701b is laterally offset from the decoupling region 701a and comprises a plurality of RRAM cells 706c-706d. The plurality of RRAM cells 706c-706d comprise a lower electrode 708 vertically separated from an upper electrode 712 by a capacitor dielectric layer 710. The upper electrode 712 is connected to a bit line BL (e.g., arranged within an overlying metal interconnect layer), which is coupled to control circuitry such as a row/column decoder or a sense amplifier. The lower electrode 708 is connected to the lower metal wire layer 704c, which is further connected to a first source/drain region 717a of an underlying transistor device 716 by way of one or more metal layers (e.g., a conductive contact 718, a first metal wire layer 704a, a first metal via layer 714a, a second metal wire layer 704b, and a second metal via layer 714b). A second source/drain region 717b of the transistor device 716 is connected to a source line SL by way of one or more additional metal layers. A word line (WL) for addressing the plurality of RRAM cells 706c-706d is coupled to a gate electrode 716g of the transistor device 716.

The lower electrode 708 and the upper electrode 712 of the plurality of RRAM cells 706c-706d and the lower electrode 708 and the upper electrode 712 of the plurality of MIM capacitors 706a-706b may be a same material. Similarly, the capacitor dielectric layer 710 of the plurality of RRAM cells 706c-706d and the capacitor dielectric layer 710 of the plurality of MIM capacitors 706a-706b may be a same material. In some embodiments, plurality of MIM capacitors 706a-706b and the plurality of RRAM cells 706c-706d may be located within a same dielectric layer (i.e., at a substantially same vertical location in a BEOL metallization stack). In other embodiments, the plurality of MIM capacitors 706a-706b and the plurality of RRAM cells 706c-706d may be located within a different dielectric layer (i.e., at a different vertical location in the BEOL metallization stack).

In some embodiments, the plurality of MIM capacitors 706a-706b and the plurality of RRAM cells 706c-706d have a same structure (i.e., a same size, a same shape, same layers). For example, in some embodiments, a capping layer (not shown) may be located between the capacitor dielectric layer 710 and the upper electrode 712 of the plurality of MIM capacitors 706a-706b and the plurality of RRAM cells 706c-706d. The capping layer is configured to store oxygen, which can facilitate resistance changes within the capacitor dielectric layer 710. In some embodiments, the capping layer may comprise a metal or a metal oxide that is relatively low in oxygen concentration (e.g., titanium (Ti), hafnium (Hf), platinum (Pt), and/or aluminum (Al), titanium oxide ($TiO_x$), hafnium oxide ($HfO_x$), zirconium oxide ($ZrO_x$), germanium oxide ($GeO_x$), or cesium oxide ($CeO_x$)). In other embodiments, a hard mask layer may be arranged over the upper electrode 712 of the plurality of MIM capacitors 706a-706b and the plurality of RRAM cells 706c-706d.

The logic region 701c comprises a plurality of metal layers laterally offset from the decoupling region 701a and the embedded memory region 701b. The plurality of metal layers comprise conductive contacts 718, metal wire layers 704, and metal via layers 714, vertically inter-leaved within the dielectric layers 702a-702e. For example, a first dielectric layer 702a may comprise a conductive contact 718 of tungsten, a second dielectric layer 702b may comprise a metal wire layer 704a of copper, a third dielectric layer 702c may comprise a metal via layer 714a of copper, etc. In some embodiments, a metal via layer (e.g., 714c) within the logic region 701c may be at a same vertical position within the BEOL metallization stack (i.e., be vertically aligned with) as the plurality of RRAM cells 706c-706d within the embedded memory region 701b and the plurality of MIM capacitors 706a-706b within the decoupling region 701a. For example, metal via layer 714c, the RRAM cells 706c-706d, and the MIM capacitors 706a-706b may have lower surfaces that are arranged along a horizontal plane.

FIGS. 8-13 illustrates cross-sectional views 800-1300 showing a method of forming an integrated chip comprising a voltage divider having a plurality of MIM structures.

Figure 8:
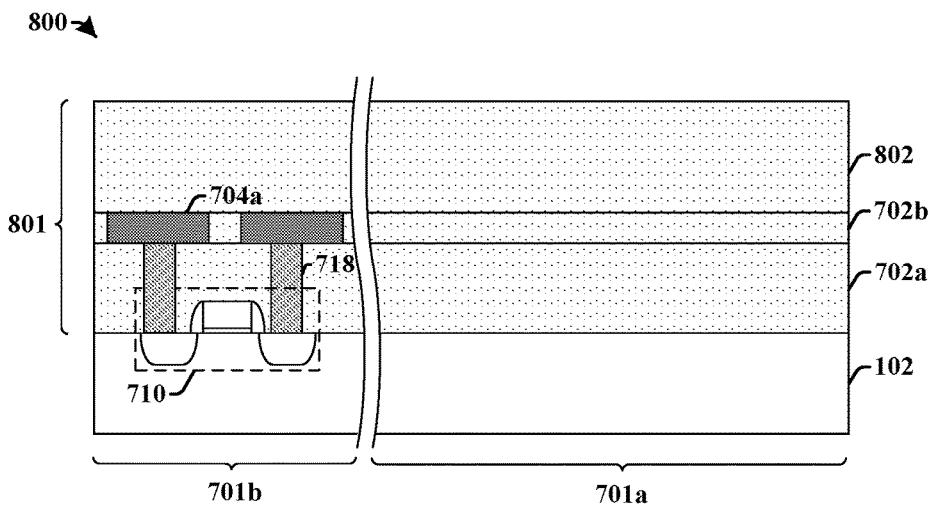
FIGS. 8-13 illustrate some embodiments of cross-sectional views showing a method of forming an integrated chip comprising a voltage divider having a plurality of MIM capacitors.

As shown in cross-sectional view 800 of FIG. 8, a substrate 102 is provided. In various embodiments, the substrate 102 may comprise any type of semiconductor body (e.g., silicon/CMOS bulk, SiGe, SOI, etc.) such as a semiconductor wafer or one or more die on a wafer, as well as any other type of semiconductor and/or epitaxial layers formed thereon and/or otherwise associated therewith. The substrate 102 comprises a decoupling region 701a and an embedded memory region 701b. In some embodiments, the embedded memory region 701b and/or the decoupling region 701a may comprise a transistor device 716 located within the substrate 102.

A plurality of dielectric layers 702a, 702b, and 802 are formed within a BEOL metallization stack 801 over the substrate 102. The plurality of dielectric layers 702a, 702b, and 802 may comprise a low-k dielectric material, an ultra low-k dielectric material, an extreme low-k dielectric material, and/or an oxide. In some embodiments, the plurality of dielectric layers 702a, 702b, and 802 may be formed by way of a deposition process (e.g., chemical vapor deposition (CVD), physical vapor deposition (PVD), atomic layer deposition (ALD), etc.). In some embodiments, one or more metal layers may be formed within the dielectric layers 702a and 702b within the embedded memory region 701b, but not within the decoupling region 701a.

Figure 9:
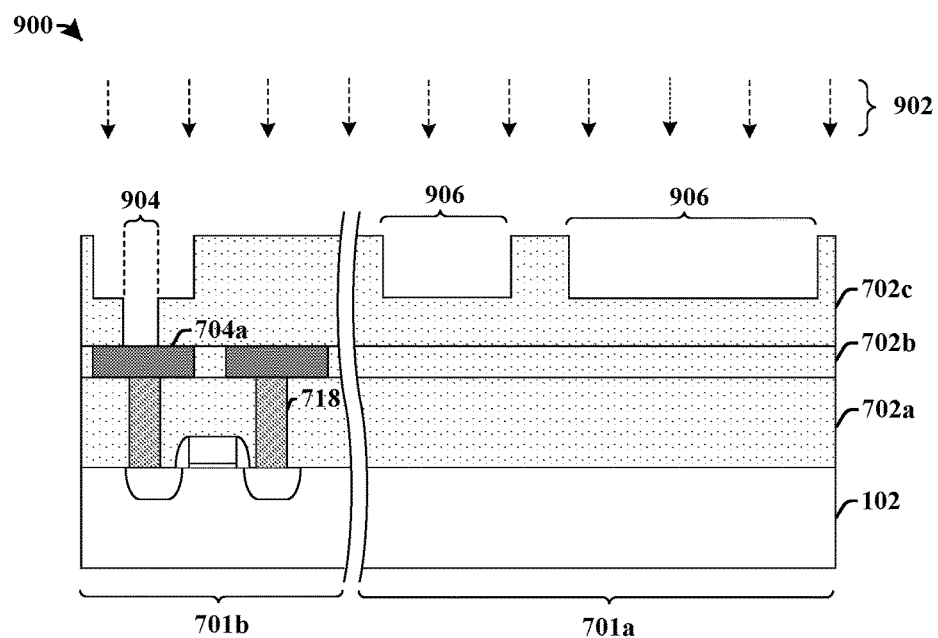

As shown in cross-sectional view 900 of FIG. 9, dielectric layer 702c is selectively exposed to an etchant 902 (e.g., $CF_4$, $CHF_3$, $C_4F_8$, HF, etc.) configured to selectively etch the dielectric layer 702c to form a plurality of via holes 904 and a plurality of metal trenches 906.

Figure 10:
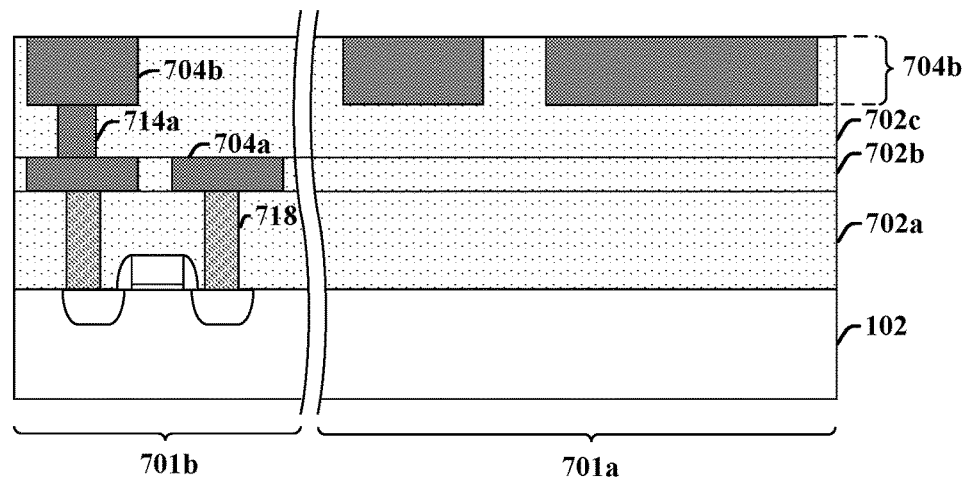

As shown in cross-sectional view 1000 of FIG. 10, a via layer 714a and a lower metal wire layer 704b comprising one or more lower metal interconnect structures are formed by depositing a conductive material (e.g., copper and/or aluminum) within the plurality of via holes 904 and the plurality of metal trenches 906, respectively. In some embodiments, a deposition process may be used to form a seed layer within the plurality of via holes, followed by a subsequent plating process (e.g., an electroplating process, an electro-less plating process) that forms the metal material to a thickness that fills the plurality of via holes and metal trenches. In some embodiments, a chemical mechanical polishing (CMP) process may be used to remove excess of the metal material from a top surface of the dielectric layer 702c. Although cross-sectional views 900-100 illustrate the lower metal wire layer 704b and the via layer 714a being formed by a dual damascene process, it will be appreciated that in alternative embodiments a single damascene process may be used to form the layers.

Figure 11:
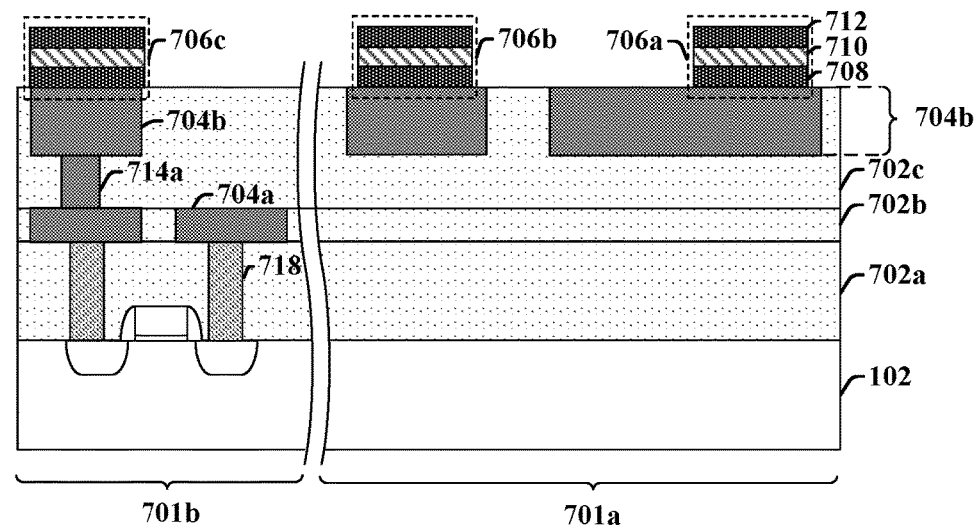

As shown in cross-sectional view 1100 of FIG. 11, a plurality of MIM capacitors 706a-706b and RRAM cells 706c are formed over the lower metal wire layer 704b. The plurality of MIM capacitors 706a-706b and RRAM cells 706c respectively comprise a lower electrode 708 separated from an upper electrode 712 by a capacitor dielectric layer 710.

The plurality of MIM capacitors 706a-706b and RRAM cells 706c may be formed using a same process. The same process uses a same mask set and same materials to form the lower electrode 708, the upper electrode 712, and the capacitor dielectric layer 710 for both the plurality of MIM capacitors 706a-706b and RRAM cells 706c. For example, in some embodiments, the plurality of MIM capacitors 706a-706b and RRAM cells 706c may be formed by depositing a bottom electrode layer over the lower metal wire layer 704b, a capacitive dielectric layer over the bottom electrode layer, and an upper electrode layer over the capacitive dielectric layer. A masking layer is then selectively formed over the upper electrode layer, and the upper electrode layer and the capacitive dielectric layer are selectively etched according to the hard mask layer to form an upper electrode 712 by a capacitor dielectric layer 710 for the plurality of MIM capacitors 706a-706b and RRAM cells 706c. The lower electrode layer may be subsequently etched according to the upper electrode 712 to form a lower electrode 708 for the plurality of MIM capacitors 706a-706b and RRAM cells 706c.

In some embodiments, the lower electrode 708 and the upper electrode 712 may comprise a conductive material such as titanium nitride (TiN), tantalum nitride (TaN), tungsten (W) or copper (Cu). In some embodiments, the dielectric layer may comprise a high-k dielectric material, such as hafnium oxide ($HfO_x$), zirconium oxide ($ZrO_x$), aluminum oxide ($AlO_x$), nickel oxide ($NiO_x$), tantalum oxide ($TaO_x$), or titanium oxide ($TiO_x$).

Figure 12:
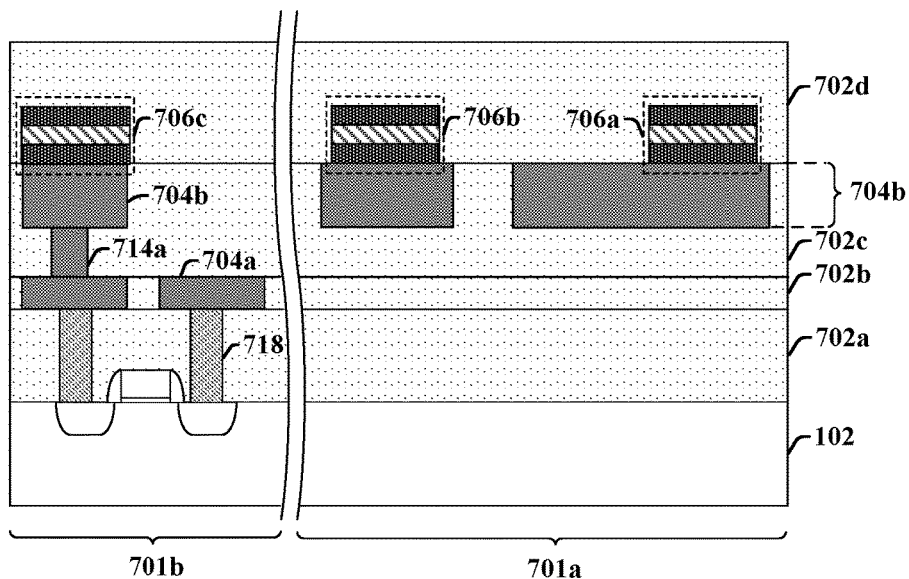

As shown in cross-sectional view 1200 of FIG. 12, a dielectric layer 702d is formed over the plurality of MIM capacitors 706a-706b and RRAM cells 706c. The dielectric layer 702d may be formed by way of a deposition process (e.g., CVD, PVD, ALD, etc.).

Figure 13:
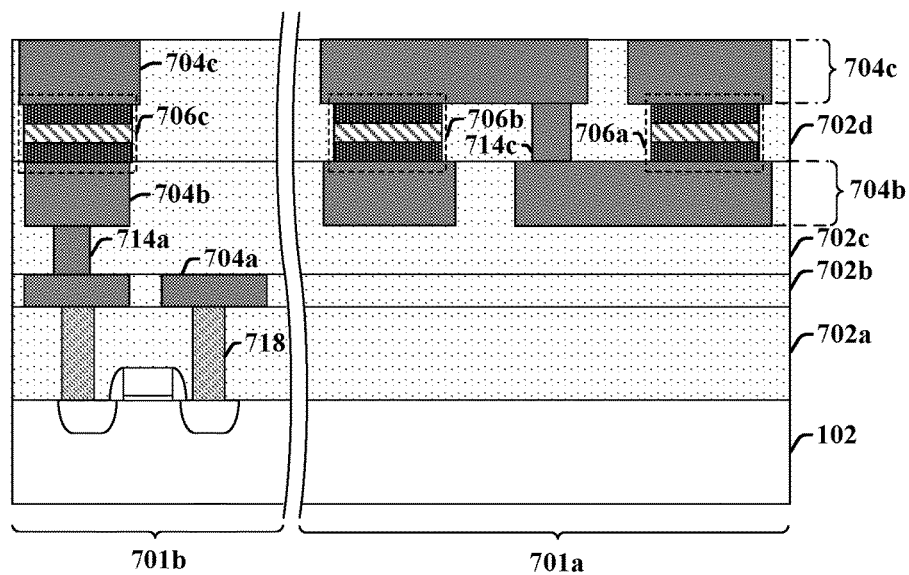

As shown in cross-sectional view 1300 of FIG. 13, a via layer 714b and an upper metal wire layer 704d comprising one or more upper metal interconnect structures are formed in the upper dielectric layer 702d. The via layer 714b vertically extends between metal wire layer 704c and metal wire layer 704d. One or more of the upper metal wire layer 704d, the lower metal wire layer 704b, and the via layer 714b connect the plurality of MIM capacitors 706a-706b in a series connection without connecting the RRAM cells 706c in a series connection.

In some embodiments, the via layer 714b and the upper metal wire layer 704d may be formed using a dual damascene process, which selectively exposes dielectric layer 702d to an etchant (e.g., $CF_4$, $CHF_3$, $C_4F_8$, HF, etc.) configured to form a plurality of via holes and a plurality of metal trenches overlying the plurality of via holes. A metal material (e.g., copper, aluminum, etc.) is subsequently formed in the plurality of via holes and metal trenches.

Figure 14:
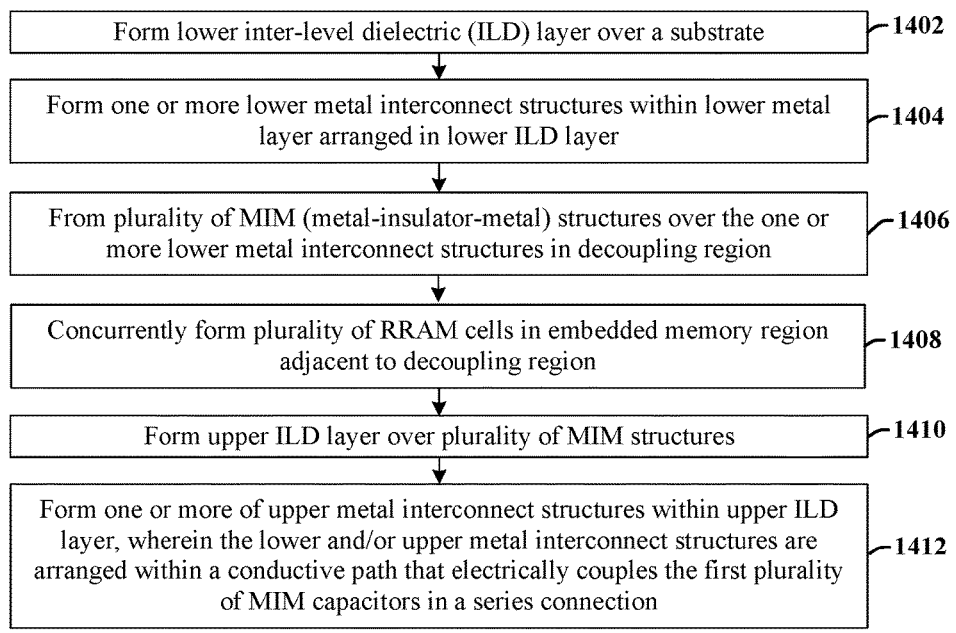
FIG. 14 illustrates some embodiments of a method of forming an integrated chip comprising a voltage divider having a plurality of MIM capacitors.

FIG. 14 illustrates some additional embodiments of an integrated chip comprising disclosed voltage divider circuit comprising MIM capacitors.

While method 1400 is described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases. Although method 1400 is described in relation to FIGS. 8-13, it will be appreciated that the method 1400 is not limited to such structures, but instead may stand alone as a method independent of the structures.

At 1402, a lower inter-level dielectric (ILD) layer is formed over a substrate. FIG. 8 illustrates some embodiments of a cross-sectional view 800 corresponding to act 1402.

At 1404, one or more lower metal interconnect structures are formed within a lower metal layer disposed within the lower ILD layer. FIGS. 9-10 illustrates some embodiments of cross-sectional views 900-1000 corresponding to act 1404.

At 1406, a plurality of MIM (metal-insulator-metal) structures are formed over the one or more lower metal interconnect structures in a decoupling region. FIG. 11 illustrates some embodiments of a cross-sectional view 1100 corresponding to act 1406.

At 1408, in some embodiments, a plurality of RRAM cells may be concurrently formed in an embedded memory region laterally adjacent to the decoupling region. FIG. 11 also illustrates some embodiments of a cross-sectional view 1100 corresponding to act 1408.

At 1410, an upper ILD layer is formed over the plurality of MIM structures. FIG. 12 illustrates some embodiments of a cross-sectional view 1200 corresponding to act 1410.

At 1412, one or more upper metal interconnect structures are formed within the upper ILD layer overlying the plurality of MIM structures. The one or more upper metal interconnect structures and/or the one or more lower metal interconnect structures are arranged within a conductive path that electrically couples the plurality of plurality of RRAM cells in a series connection. In some embodiments, a via layer may also be formed within the upper ILD layer, at a location within the conductive path that is vertically between the one or more upper metal interconnect structures and the one or more lower metal interconnect structures. FIG. 13 illustrates some embodiments of a cross-sectional view 1300 corresponding to act 1412.

Therefore, the present disclosure relates to an integrated circuit having a plurality of MIM decoupling capacitors connected in series between a first voltage potential and a second voltage potential to prevent damage to the MIM decoupling capacitors.

In some embodiments, the present disclosure relates to an integrated chip. The integrated chip comprises a lower metal interconnect layer arranged over a substrate. A plurality of MIM (metal-insulator-metal) structures are arranged over the lower metal interconnect layer, and a plurality of memory cells are arranged over the lower metal interconnect layer at a location laterally offset from the plurality of MIM structures. An upper metal interconnect layer is arranged over the plurality of MIM structures and the plurality of memory cells. One or both of the lower metal interconnect layer and the upper metal interconnect layer are comprised within a conductive path that electrically couples the plurality of MIM structures in a series connection. The plurality of MIM structures and the plurality of memory cells comprise multi-layer structures having a substantially same shape.

In other embodiments, the present disclosure relates to an integrated chip. The integrated chip comprises a lower metal interconnect layer arranged within a lower ILD layer. The lower metal interconnect layer is vertically separated from a substrate by one or more additional ILD layers arranged between the lower ILD layer and the substrate. A plurality of MIM (metal-insulator-metal) structures are arranged over the lower metal interconnect layer. An upper metal interconnect layer is arranged within an upper ILD layer over the plurality of MIM structures. One or both of the lower metal interconnect layer and the upper metal interconnect layer are comprised within a conductive path that electrically couples the plurality of MIM structures in a series connection.

In yet other embodiments, the present disclosure relates to a method of forming an integrated chip. The method comprises forming one or more lower metal interconnect structures over a semiconductor substrate. The method further comprises forming a plurality of MIM (metal-insulator-metal) structures over the one or more lower metal interconnect structures, and forming a plurality of memory cells concurrent with forming the plurality of MIM structures. The method further comprises forming one or more upper metal interconnect structures within an upper ILD layer over the plurality of memory cells and the plurality of MIM structures. One or both of the one or more lower metal interconnect structures and the one or more upper metal interconnect structures are comprised within a conductive path that electrically couples the plurality of MIM structures in a series connection. The plurality of MIM structures and the plurality of memory cells comprise multi-layer structures having a substantially same shape.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated chip, comprising:
   a lower interconnect layer vertically separated from a substrate by a first inter-level dielectric (ILD) layer;
   a conductive contact extending from a transistor device within the substrate to an upper surface of the first ILD layer;
   a plurality of MIM (metal-insulator-metal) structures arranged over the lower interconnect layer; and
   an upper interconnect layer over the plurality of MIM structures, wherein one or both of the lower interconnect layer and the upper interconnect layer are comprised within a conductive path that electrically couples the plurality of MIM structures in a series connection.

2. The integrated chip of claim 1, further comprising:
   an additional ILD layer laterally surrounding the lower interconnect layer and separated from the substrate by the first ILD layer, wherein a bottom surface of the lower interconnect layer is completely covered by the additional ILD layer.

3. The integrated chip of claim 1, wherein the lower interconnect layer and the upper interconnect layer comprise copper.

4. The integrated chip of claim 1, wherein the conductive contact is coupled to a first interconnect wire layer disposed within a second ILD layer that is between the first ILD layer and the lower interconnect layer.

5. The integrated chip of claim 1, wherein the lower interconnect layer comprises a first interconnect structure continuously extending from directly below a first MIM structure of the plurality of MIM structures to directly below a second MIM structure of the plurality of MIM structures to connect the first MIM structure in series with the second MIM structure.

6. The integrated chip of claim 5,
   wherein the lower interconnect layer comprises a second interconnect structure separated from the first interconnect structure; and
   wherein the second interconnect structure is directly below a third MIM structure of the plurality of MIM structures.

7. The integrated chip of claim 6, further comprising:
   an additional ILD layer laterally surrounding the lower interconnect layer and separated from the substrate by the first ILD layer, wherein a bottom of the first interconnect structure is completely covered by the additional ILD layer.

8. The integrated chip of claim 1, wherein the plurality of MIM structures respectively comprise:
   a first conductive electrode;
   a dielectric layer lining sidewalls and a horizontally extending surface of the first conductive electrode; and
   a second conductive electrode completely filing a cavity defined by sidewalls and a horizontally extending surface of the dielectric layer.

9. The integrated chip of claim 1,
   wherein the plurality of MIM structures respectively comprise a first lower electrode separated from a first upper electrode by a first dielectric layer; and
   wherein the first dielectric layer extends to either a first horizontal plane extending along a top surface of the first upper electrode or a second horizontal plane extending along a bottom surface of the first lower electrode.

10. The integrated chip of claim 1, further comprising:
    a gate electrode arranged over the substrate between a source region and a drain region, wherein an uppermost surface of the gate electrode is separated from the lower interconnect layer by the first ILD layer.

11. An integrated chip, comprising:
    a lower interconnect layer vertically separated from a substrate by a first inter-level dielectric (ILD) layer;
    a plurality of MIM (metal-insulator-metal) structures arranged over the lower interconnect layer, wherein the lower interconnect layer continuously extends from directly below one of the plurality of MIM structures to laterally beyond an outermost sidewall of the one of the plurality of MIM structures; and
    an upper interconnect layer over the plurality of MIM structures, wherein the upper interconnect layer is in a same inter-level dielectric layer as the plurality of MIM structures, and wherein one or both of the lower interconnect layer and the upper interconnect layer are comprised within a conductive path that electrically couples the plurality of MIM structures in a series connection.

12. The integrated chip of claim 11, further comprising:
a plurality of memory cells arranged over the substrate at a location laterally offset from the plurality of MIM structures, wherein the plurality of MIM structures and the plurality of memory cells respectively comprise a plurality of stacked layers having same materials.

13. The integrated chip of claim 11, further comprising:
a via arranged between the lower interconnect layer and the upper interconnect layer at a location that is between two of the plurality of MIM structures, wherein the via comprises a same material as the lower interconnect layer and the upper interconnect layer.

14. The integrated chip of claim 13, wherein the via is arranged completely over a lower ILD layer laterally surrounding the lower interconnect layer.

15. The integrated chip of claim 11, wherein a vertical line that is perpendicular to an upper surface of the substrate bisects one of the plurality of MIM structures and extends through the lower interconnect layer and the upper interconnect layer.

16. An integrated chip, comprising:
a first interconnect layer having a first interconnect structure arranged over a substrate;
a second interconnect layer having a second interconnect structure vertically separated from the first interconnect structure;
a plurality of MIM (metal-insulator-metal) structures arranged between the first interconnect layer and the second interconnect layer, wherein the plurality of MIM structures comprise a first MIM structure having a first lower electrode separated from a first upper electrode by a first dielectric layer and a second MIM structure; and
wherein the first lower electrode directly contacts an upper surface of the first interconnect layer that continuously extends from directly below the first MIM structure to directly below the second MIM structure to connect the first MIM structure in series with the second MIM structure.

17. The integrated chip of claim 16, wherein the first interconnect layer is arranged within a lower inter-level dielectric (ILD) layer vertically separated from the substrate by an additional ILD layer arranged between the lower ILD layer and the substrate.

18. The integrated chip of claim 16,
wherein the second MIM structure comprises a second lower electrode separated from a second upper electrode by a second dielectric layer; and
wherein the second lower electrode directly contacts the upper surface of the first interconnect layer.

19. The integrated chip of claim 16, further comprising:
a gate structure arranged over the substrate between a source region and a drain region, wherein an additional inter-level dielectric (ILD) layer is disposed between a top of the gate structure and a lower ILD layer laterally surrounding the first interconnect layer.

20. The integrated chip of claim 17, wherein the additional ILD layer laterally surrounds a conductive contact disposed over a top surface of the substrate.

* * * * *